(12) United States Patent
Yasunaga

(10) Patent No.: US 6,607,940 B2
(45) Date of Patent: Aug. 19, 2003

(54) METHOD OF MANUFACTURING SEMICONDUCTOR DEVICES AND SEMICONDUCTOR DEVICES MADE ACCORDING TO THE METHOD

(75) Inventor: Shoshi Yasunaga, Kitakyushu (JP)

(73) Assignee: Mitsui High-tec Inc., Fukuota (JP)

( * ) Notice: Subject to any disclaimer, the term of this patent is extended or adjusted under 35 U.S.C. 154(b) by 0 days.

(21) Appl. No.: 09/792,014

(22) Filed: Feb. 21, 2001

(65) Prior Publication Data

US 2001/0041386 A1 Nov. 15, 2001

(30) Foreign Application Priority Data

Feb. 21, 2000 (JP) ........................................ 2000-043295

(51) Int. Cl.<sup>7</sup> .......................... H01L 21/44; H01L 21/48; H01L 21/50
(52) U.S. Cl. ..................... 438/112; 438/123; 438/124; 438/126; 438/127
(58) Field of Search ................................ 438/112, 127, 438/FOR 380, 123, 124, 126, FOR 367, FOR 374; 257/676, 686, 723, 790, 787; 264/272.17

(56) References Cited

U.S. PATENT DOCUMENTS

| | | | | |
|---|---|---|---|---|
| 5,034,350 A | * | 7/1991 | Marchisi | 264/272.17 |
| 5,200,362 A | * | 4/1993 | Lin et al. | 29/841 |
| 5,273,938 A | * | 12/1993 | Lin et al. | 438/107 |
| 5,646,829 A | * | 7/1997 | Sota | 257/666 |
| 5,783,463 A | * | 7/1998 | Takehashi et al. | 438/111 |
| 5,861,668 A | * | 1/1999 | Cha | 257/690 |
| 6,081,978 A | * | 7/2000 | Utsumi et al. | 264/272.13 |
| 6,133,067 A | * | 10/2000 | Jeng et al. | 438/110 |
| 6,326,240 B1 | * | 12/2001 | Liaw | 438/112 |

\* cited by examiner

Primary Examiner—George Fourson
Assistant Examiner—Michelle Estrada
(74) Attorney, Agent, or Firm—Wood, Phillips, Katz, Clark & Mortimer

(57) ABSTRACT

A method of manufacturing semiconductor devices. The method includes the steps of: providing a lead frame assembly having oppositely facing first and second sides; mounting a first semiconductor chip on the first side of the lead frame assembly; mounting a second semiconductor chip on the second side of the lead frame assembly; electrically connecting the first semiconductor chip to a first lead on the lead frame assembly; electrically connecting the second semiconductor chip to a second lead on the lead frame assembly; applying sealing resin to the first and second sides of the lead frame assembly with the first and second semiconductor chips mounted thereon; and after applying sealing resin, separating the lead frame assembly into first and second semiconductor devices. The first semiconductor device consists of a first portion of the lead frame assembly, the first semiconductor chip thereon, and the first lead electrically connected to the first semiconductor chip. The second semiconductor device consists of a second portion of the lead frame assembly, the second semiconductor chip thereon, and the second lead electrically connected to the second semiconductor chip.

20 Claims, 8 Drawing Sheets

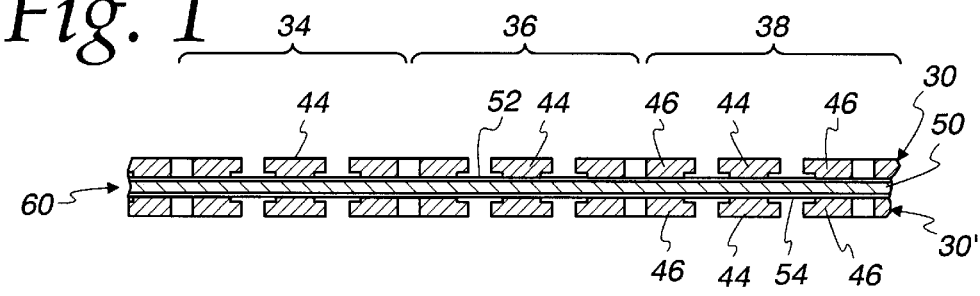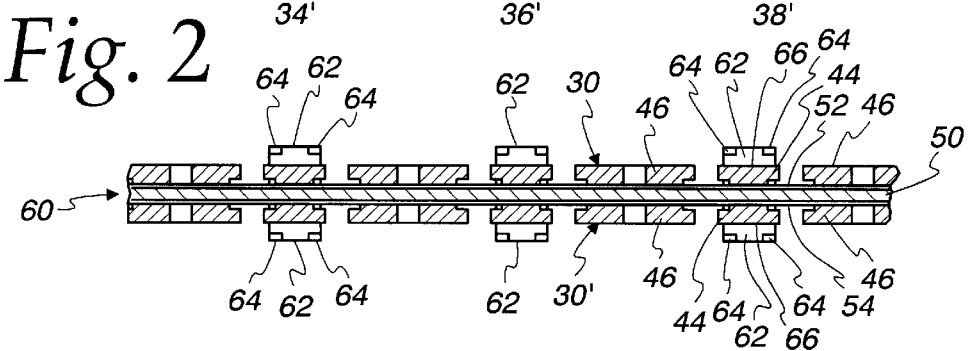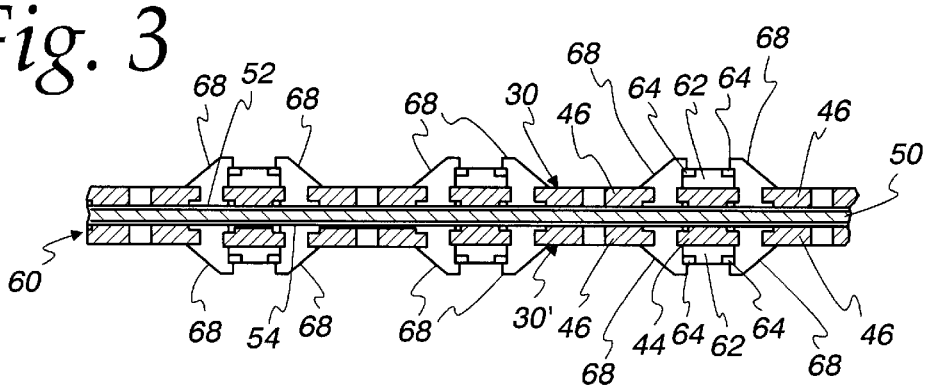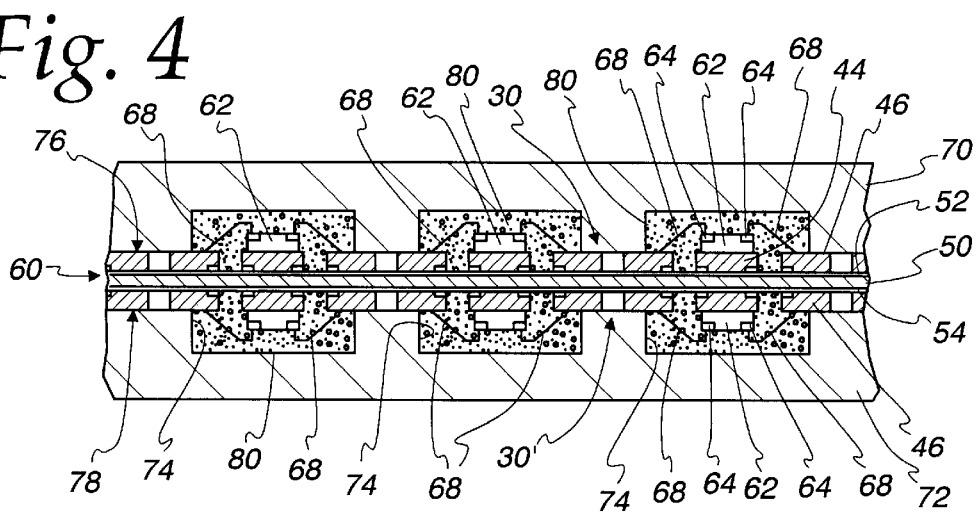

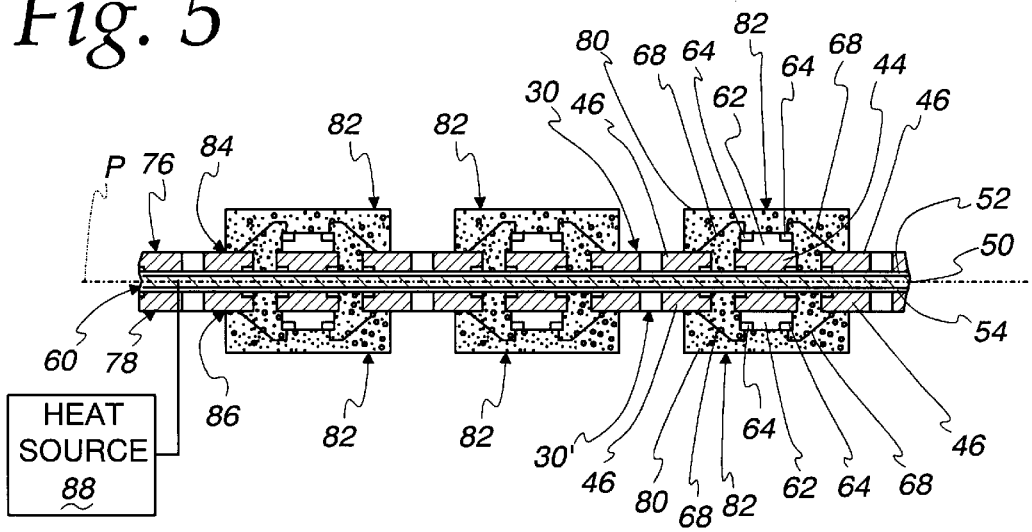
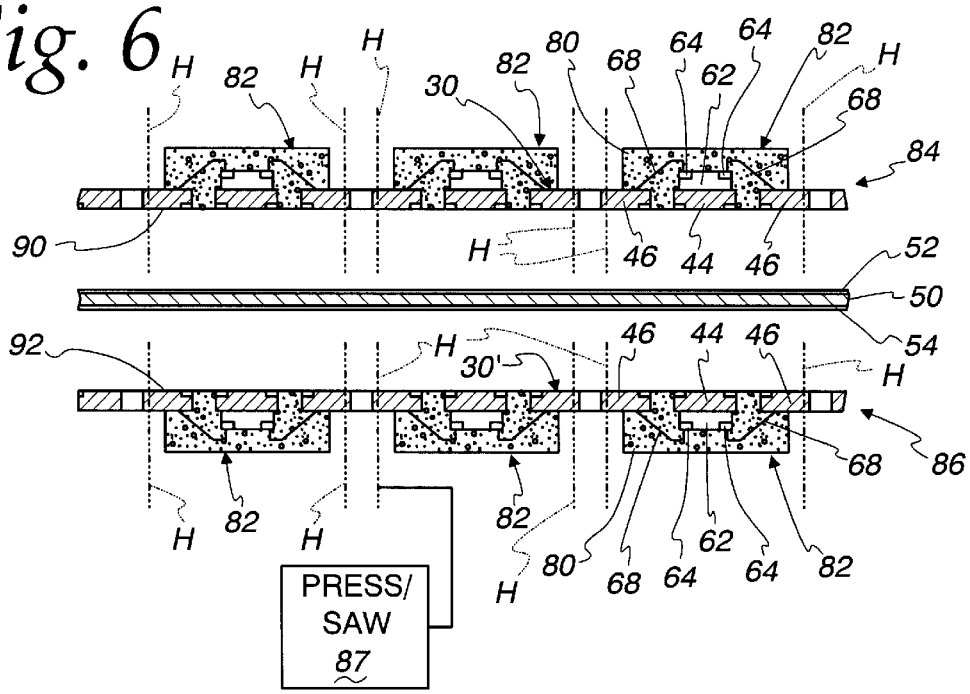
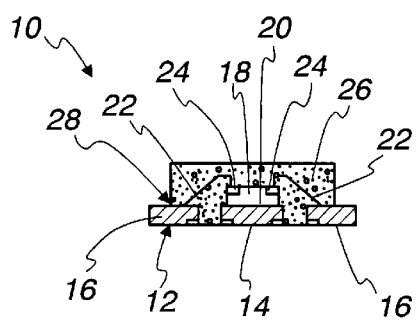

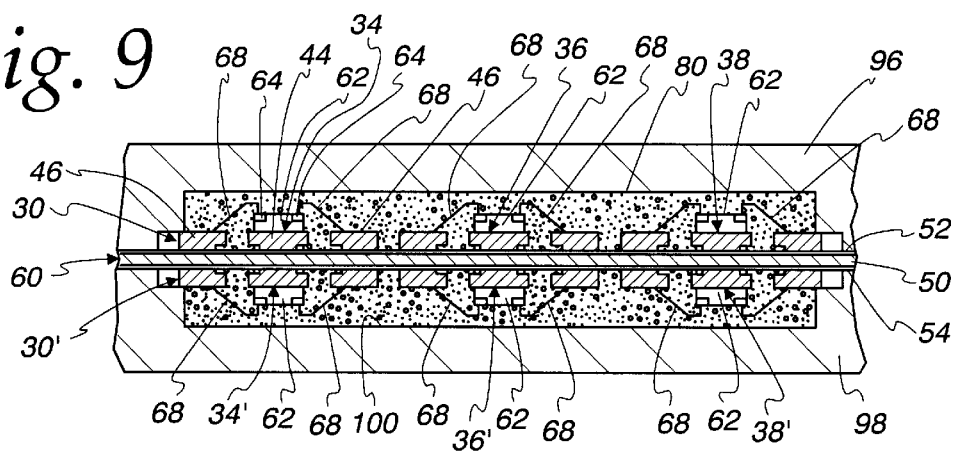
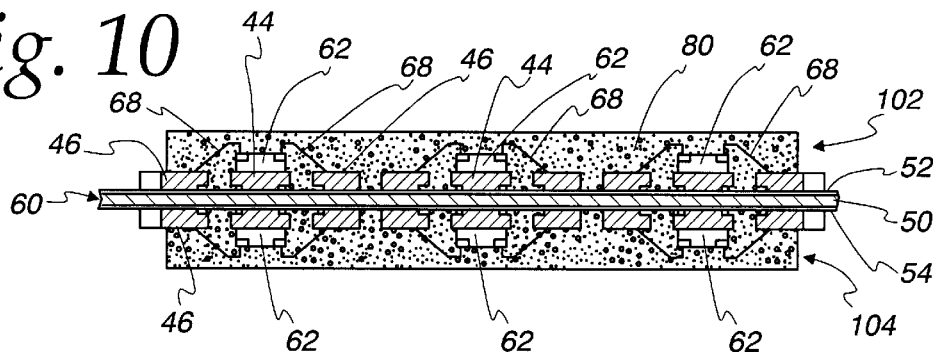
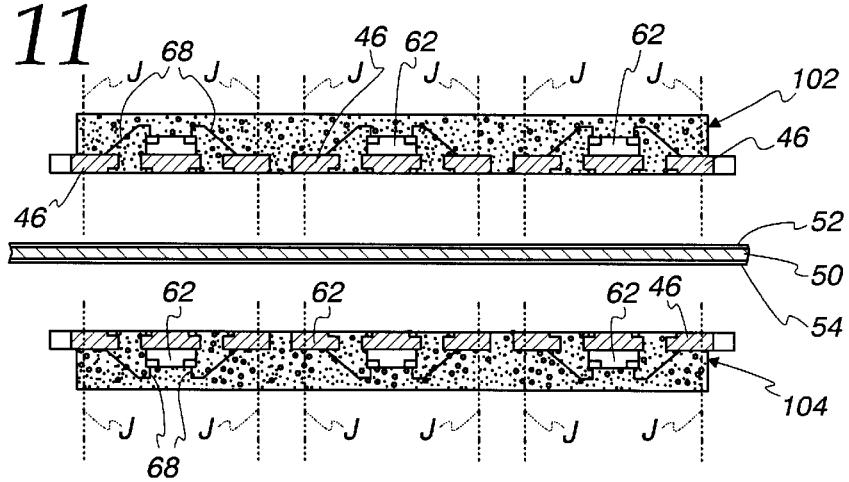
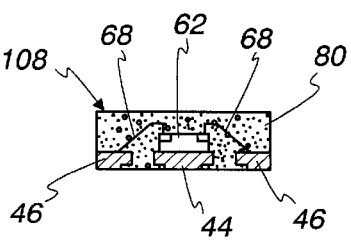

METHOD OF MANUFACTURING SEMICONDUCTOR DEVICES AND SEMICONDUCTOR DEVICES MADE ACCORDING TO THE METHOD

BACKGROUND OF THE INVENTION

1. Field of the Invention

This invention relates to semiconductor devices of the type having a conductive lead frame with semiconductor chips and leads mounted on one side thereof, with a sealing resin applied to the one side.

2. Background Art

It is known to manufacture semiconductor devices by providing a lead frame assembly made up of a plurality of conductive unit lead frames interconnected by a tie bar network. Each unit lead frame has a support and associated leads. Semiconductor chips are mounted on the supports using heat resistant adhesive and electrically connected to the leads using conductive elements, such as wires. The supports are spaced from each other at predetermined intervals. A heat resistant sealing resin binder layer is applied to one side of the lead frame and, once cured to a hardened state, maintains the relative positions of the supports, semiconductor chips, and wires. Individual semiconductor devices are separated by cutting through the resin layer and lead frame at strategic locations.

In this conventional construction, the semiconductor chips and sealing resin are applied to only one side of the lead frame. The sealing resin is typically applied at a mold temperature of 180° to 200° C. However, due to the difference in the thermal expansion and contraction characteristics of the sealing resin and lead frame, warping of the resulting semiconductor device may result during the manufacturing process. This is particularly a problem with a thin semiconductor device. Cracks may form in the semiconductor device which may adversely affect conductivity. Additionally, the connecting leads may not be uniformly situated as a result of which the connection characteristics of the semiconductor devices may be compromised. Also, there is a tendency of the sealing resin to migrate to the bottom side of the semiconductor device forming mold "flash" over the leads that potentially blocks the conductive path to one or more leads. This flash may have to be removed. This potentially adds one or more steps to the manufacturing process and may increase the attendant costs.

SUMMARY OF THE INVENTION

In one form, the invention is directed to a method of manufacturing semiconductor devices. The method includes the steps of: providing a lead frame assembly having oppositely facing first and second sides; mounting a first semiconductor chip on the first side of the lead frame assembly; mounting a second semiconductor chip on the second side of the lead frame assembly; electrically connecting the first semiconductor chip to a first lead on the lead frame assembly; electrically connecting the second semiconductor chip to a second lead on the lead frame assembly; applying sealing resin to the first and second sides of the lead frame assembly with the first and second semiconductor chips mounted thereon; and after applying sealing resin, separating the lead frame assembly into first and second semiconductor devices. The first semiconductor device consists of a first portion of the lead frame assembly, the first semiconductor chip thereon, and the first lead electrically connected to the first semiconductor chip. The second semiconductor device consists of a second portion of the lead frame assembly, the second semiconductor chip thereon, and the second lead electrically connected to the second semiconductor chip.

The step of providing a lead frame assembly may involve joining first and second lead frame portions together, with the step of separating the lead frame assembly involving separating the first and second lead frame portions from each other.

In an alternative method, the step of providing a lead frame assembly may involve providing a conductive layer, with the step of separating the lead frame assembly involving cutting the conductive layer through a plane between the first and second sides of the lead frame assembly.

The method may further include the steps of mounting at least one additional semiconductor chip on each of the first and second sides of the lead frame assembly and electrically connecting each of the at least one additional semiconductor chips on the first and second sides of the lead frame assembly to a lead before applying sealing resin. The step of separating the lead frame assembly may involve the step of separating the lead frame assembly into first and second lead frame subassemblies. The first lead frame subassembly is defined by the first semiconductor chip and the one additional semiconductor mounted on the first side of the lead frame assembly. The step of separating the lead frame assembly may further involve cutting the first lead frame subassembly so as to define the first semiconductor device and a third semiconductor device consisting of a portion of the lead frame assembly with the one additional semiconductor chip mounted on the first side of the lead frame assembly so that the third semiconductor device is separate from the first semiconductor device.

The step of separating the lead frame assembly may involve separating the lead frame assembly into first and second lead frame subassemblies, with the second lead frame subassembly made up of the second semiconductor chip and the one additional semiconductor chip mounted on the second side of the lead frame assembly. The method may further include cutting the second lead frame subassembly so as to define the second semiconductor device and a fourth semiconductor device consisting of a portion of the lead frame assembly with the one additional semiconductor chip mounted on the second side of the lead frame assembly so that the fourth semiconductor device is separate from the second semiconductor device.

The step of applying sealing resin may involve using a mold to confine the sealing resin.

Through the mold, discrete masses of sealing resin may be applied over and around each of the first semiconductor chip and the at least one additional semiconductor chip on the first side of the lead frame assembly.

The step of cutting the first lead frame assembly may involve cutting between the discrete masses of sealing resin.

In one form, the step of joining the first and second lead frame portions involves using a sheet with first and second adhesive layers and adhering the first lead frame portion to the first adhesive layer and the second lead frame portion to the second adhesive layer.

The lead frame may have a sheet form.

In one form, the step of applying sealing resin involves applying a substantially uniform thickness of sealing resin continuously between the first semiconductor chip and the at least one additional semiconductor chip mounted on the first side of the lead frame assembly.

In one form, the first and second portions of the lead frame assembly each have a first thickness and the conductive layer has a thickness three to five times the first thickness.

The step of joining the first and second lead frame portions may involve joining the first and second lead frame portions using an adhesive. The step of separating the lead frame assembly may involve softening the adhesive to allow the first and second lead frame portions to be separated from each other.

In one form, the step of cutting the first lead frame assembly involves cutting using a cutting blade having a width on the order of 0.1 mm.

In one form, the adhesive has a higher melting point than the melting point for the sealing resin.

The adhesive may be at least one of a) a polyester-type hot melt binder, b) a polyimide-type hot melt binder, and c) a thermoplastic rubber-type binder.

The sealing resin may be an epoxy resin.

The first and second semiconductor devices may be the same.

In one form, the step of cutting the first lead frame subassembly involves cutting the first lead frame subassembly without cutting through the sealing resin on the first side of the first lead frame subassembly.

The step of cutting the first lead frame subassembly may involve cutting the first lead frame subassembly by cutting through the sealing resin on the first side of the lead frame subassembly.

The invention is also directed to a plurality of semiconductor devices made according to the process described above.

BRIEF DESCRIPTION OF THE DRAWINGS

FIGS. 1–6 show the steps of sequentially forming a semiconductor device, according to the present invention wherein:

FIG. 1 is a cross-sectional view of a lead frame assembly;

FIG. 2 is a view as in FIG. 1 with semiconductor chips mounted on the lead frame assembly;

FIG. 3 is a view as in FIGS. 1 and 2 with wires electrically connecting between the semiconductor chips and leads on the lead frame assembly;

FIG. 4 is a view as in FIGS. 1–3 showing a mold around the structure in FIG. 3 and with sealing resin poured therein;

FIG. 5 is a view as in FIG. 4 with the mold separated;

FIG. 6 is a view as in FIGS. 1–5 with lead frame subassemblies separated from each other;

FIG. 7 is a cross-sectional view of a semiconductor device made according to the method in FIGS. 1–6;

FIGS. 9–12 show the steps of sequentially forming a semiconductor device according to the present invention wherein:

FIG. 9 is a cross-sectional view of a lead frame assembly with semiconductor chips and lead wires thereon as in FIG. 3 and placed in an alternative form of mold with sealing resin filling a cavity defined by the mold;

FIG. 10 is a view as in FIG. 9 with the mold removed;

FIG. 11 is a view as in FIGS. 9 and 10 with lead frame subassemblies separated from each other;

FIG. 12 is a cross-sectional view of a semiconductor chip formed by cutting the individual lead frame subassemblies shown at FIG. 11;

FIGS. 13–19 show the steps of sequentially forming a semiconductor device according to the present invention wherein:

FIG. 13 is a cross-sectional view of a modified form of lead frame assembly;

FIG. 14 is a view as in FIG. 13 with semiconductor chips mounted on the lead frame assembly;

FIG. 15 is a view as in FIGS. 13 and 14 with wires connecting between the semiconductor chips and leads on the lead frame assembly;

FIG. 16 is a view as in FIGS. 13–15 wherein the structure of FIG. 15 is placed between mold parts, with sealing resin poured into cavities defined by the mold parts;

FIG. 17 is a view as in FIGS. 13–16 with the mold parts removed;

FIG. 18 is a view as in FIG. 17 with lead frame subassemblies in FIG. 17 separated from each other;

FIG. 19 is a cross-sectional view of a semiconductor device cut from the individual lead frame subassemblies in FIG. 18;

FIGS. 20–23 show the steps of sequentially forming a semiconductor device according to the present invention wherein:

FIG. 20 is a cross-sectional view of a structure as in FIG. 15 placed between mold parts having a different configuration than the mold parts shown in FIG. 16 and with sealing resin poured in cavities defined by the mold parts;

FIG. 21 is a view as in FIG. 20 with the mold parts removed;

FIG. 22 is a view as in FIGS. 20 and 21 wherein separate lead frame subassemblies are formed by cutting through the lead frame assembly;

FIG. 23 is a cross-sectional view of a semiconductor device that is cut from the lead frame subassemblies in FIG. 22.

DETAILED DESCRIPTION OF THE DRAWINGS

Figure 8:
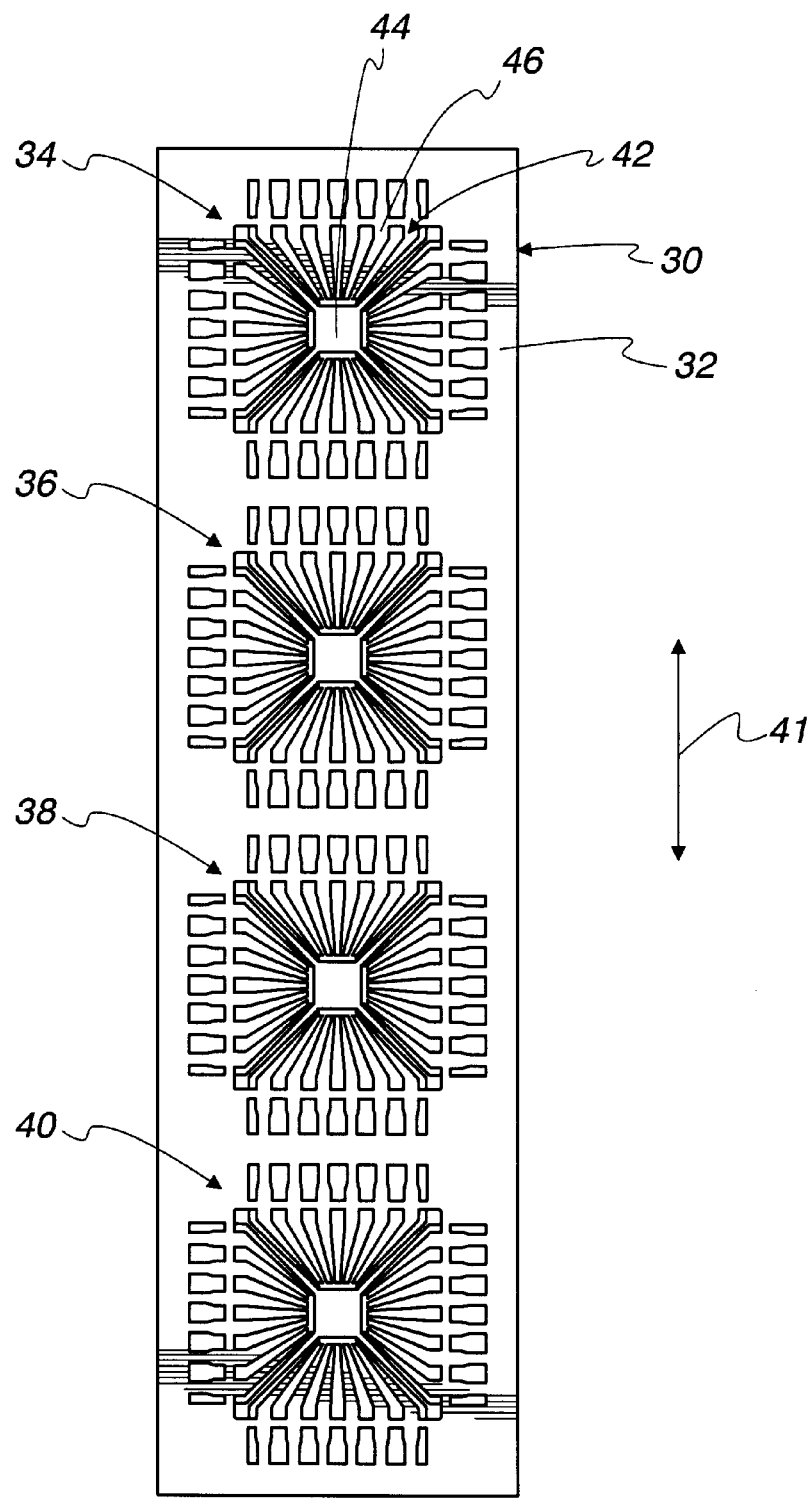
FIG. 8 is a plan view of a lead frame portion used in the method shown in FIGS. 1–6.

The manufacturing method, according to the present invention, is described herein for chip scale packaging (CSP) technology, including exemplary SON (Small Outline Non-leaded) and QFN (Quad Flat Non-leaded) semiconductor devices. In FIG. 7, a semiconductor device, made according to the present invention, is shown at 10. The semiconductor device 10 consists of a unit lead frame 12 defining a support 14 and leads 16 spaced therearound. A semiconductor chip 18 is mounted on the upwardly facing surface 20 of the support 14 and is electrically connected to the leads 16 through conductive wires 22. The wires 22 are electrically connected to the semiconductor chip 18 at electrode pads 24. A layer of heat resistant resin 26, such as epoxy resin, is applied over one side 28 of the unit lead frame 12.

As shown in FIG. 8, a lead frame portion 30 is formed from a conductive sheet material 32. The sheet material 32 may be in the form of a strip, an endless belt, or any other suitable construction. Through pressing, etching, or other suitable process, circuit patterns are formed on individual unit lead frames 34,36,38,40 spaced at regular intervals along the length of the sheet material 32, as indicated by the double-headed arrow 41. The number and configuration of the unit lead frames, 34, 36, 38, 40 shown is intended only to be exemplary, and may vary from what is shown. The individual unit lead frames 34, 36, 38, 40 on the lead frame portion 30 are interconnected by a conductive tie bar network 42.

The individual unit lead frames 34,36,38,40 may have the same or different constructions. In the embodiment shown, they have the same construction, with exemplary unit lead frame 34 having a support 44 with conductive leads 46 projecting radially therefrom at spaced intervals around the support 44.

As shown in FIG. 1, the lead frame portion 30 and an identical lead frame portion 30', having corresponding unit lead frames 34',36',38', are joined through a sheet 50 having first and second adhesive layers 52,54, respectively. The adhesive in the layers 52,54 preferably has good heat resistance as well as thermoplasticity. The sheet 50 may be a polyimide resin, or the like. The lead frame portions 30,30', the sheet 50, and adhesive layers 52,54, collectively define a lead frame assembly 60.

As shown in FIG. 2, semiconductor chips 62, each having electrode pads 64, are mounted one each to the supports 44 associated with each unit lead frame 34,36,38,34',36',38'. The semiconductor chips 62 are held in place using an adhesive layer 66, with the adhesive therein preferably being one made from heat resistant resin, such as an epoxy resin.

As shown in FIG. 3, electrically conductive elements, in this case wires 68, are used to electrically connect the electrode pads 64 with the leads 46 on each of the unit lead frames 34,36,38,34',36',38'.

As seen in FIG. 4, the lead frame assembly 60, with semiconductor chips 62 and wires 68 operatively connected thereon, is placed between cooperating mold parts 70,72 which define sealed cavities 74 around the semiconductor chips 62 on both sides 76,78 of the lead frame assembly 60. The wires 68 and a portion of the leads 46, associated with each semiconductor chip 62, reside within each cavity 74.

The cavities 74 are then filled with heat resistant, sealing resin 80. The sealing resin 80 may be an epoxy resin with a molding temperature within the range of 180° to 220° C. The adhesive in the layers 52,54 preferably has a melting temperature higher than the melting temperature of the sealing resin 80. A suitable adhesive may be, for example, at least one of a polyester-type hot melt binder, a polyimide-type hot melt binder, or a thermoplastic rubber-type binder.

As shown in FIG. 5, the mold parts 70,72 are separated from each other and the lead frame assembly 60 with the semiconductor chips 62, wires 68 and resin material 80 formed thereon. By using the mold parts 70, 72, discrete masses 82 of sealing resin are solidified on both sides 76,78 of the lead frame assembly 60. The resulting structure consists of first and second lead frame subassemblies 84,86 joined by the sheet 50 with the adhesive layers 52,54 thereon. The lead frame subassemblies 84,86 are mirror images of each other around a plane "P" bisecting the sheet 50.

As shown in FIGS. 5 and 6, through a heat source 88, the temperature of the adhesive layers 52,54 is elevated to effect softening thereof. This allows the lead frame subassemblies 84,86 to be peeled away from the adhesive layers 52,54 on the sheet 50, as shown in FIG. 6.

As also shown in FIG. 6, after separating the lead frame subassemblies 84,86, the lead frame subassemblies 84,86 are cut along lines "H", using a press or a saw 87, to thereby separate individual semiconductor devices, each having substantially the same configuration as the semiconductor device 10, shown in FIG. 7. As seen most clearly in FIG. 6, the sealing resin 80 is not applied over the cutting region so that there is no cutting resistance from the sealing resin 80.

Through this process, resin 80 is applied on both sides 76,78 of the lead frame assembly 60 during the resin sealing process. Despite the fact that the sealing resin 80 is heated to a relatively high temperature, thermal expansion forces in the sealing resin 80 on both sides of the lead frame assembly 60 are balanced. Differences in thermal expansion between the conductive material in the lead frame portions 30, 30' and sealing resin 80 is likewise balanced. Once the sealing resin 80 hardens, the lead frame subassemblies 84,86 effectively maintain their desired configuration after they are separated from the sheet 50 and adhesive layers 52,54.

Additionally, because of the presence of the sheet 50 and adhesive layers 52,54, resin 80 is blocked from migrating to the undersides 90,92 of the frame subassemblies 84,86, so as to avoid the formation of mold flash at the leads 46. As the lead frame assembly 60 is heated by the sealing resin 80, it is pushed into the adhesive layers 52, 54, to thereby form a positive seal against resin seepage that might otherwise produce flash.

In FIGS. 9–12, an alternative method of forming semiconductor devices, according to the present invention, is shown. The lead frame assembly 60 is formed, as previously described by joining lead frame portions 30, 30' using a sheet 50 with adhesive layers 52, 54. Semiconductor chips 62 and conductive wire 68 are used to connect the electrode pads 64 on the semiconductor chips 62 to leads 46, as also previously described, to arrive at the construction shown in FIG. 3. This process differs from that previously described by reason of using a different configuration of mold parts 96,98, corresponding to the mold parts 70,72, previously described. The mold parts 96,98 cooperatively bound a single cavity 100 within which the lead frames 34, 36, 38, and 34', 36' 38' reside, as shown in FIG. 9.

In FIG. 10, the mold parts 96,98 are separated from each other. Thereafter, as shown in FIG. 11, the lead frame subassemblies 102,104, corresponding to the lead frame subassemblies 84,86, however with a different configuration of the solidified sealing resin 80, are separated from each other, as by increasing the temperature of the adhesive layers 52,54 through the application of heat from the source 88. The adhesive layers 52, 54 in this and other embodiments, while being easily softened by heating, could be released in other ways, known to those skilled in this art, i.e. as by using a solvent.

As shown in FIG. 11 the lead frame assemblies 102,104 are then cut along the lines J to define individual semiconductor devices 108, as shown in FIG. 12.

Figure 13:
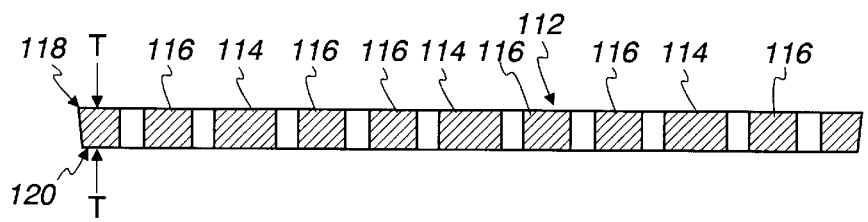

Another method of forming a semiconductor device 110, according to the present invention, is shown in FIGS. 13–19. As shown in FIG. 13, a thick lead frame assembly 112, that is a conductive layer in the form of a strip, sheet or belt, is formed conventionally as by pressing or etching to define unit lead frames each consisting of a support 114, with conductive leads 116 spaced therearound. The lead frame assembly 112 may be formed so that it has a uniform cross-sectional configuration between its opposite sides 118, 120. The thickness T of the lead frame assembly 112 is preferably three to five times the normal thickness of a lead frame, i.e. 0.3 to 0.5 mm.

Figure 14:
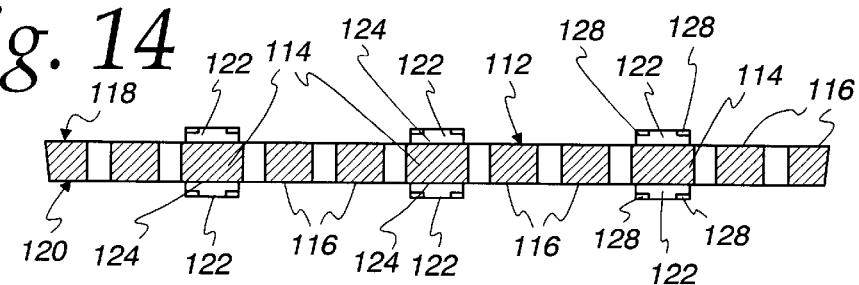

As seen in FIG. 14, semiconductor chips 122 are mounted on the supports 114 on both sides 118,120 of the lead frame assembly 112. The semiconductor chips 122 are adhered using a thermoplastic adhesive layer 124.

Figure 15:
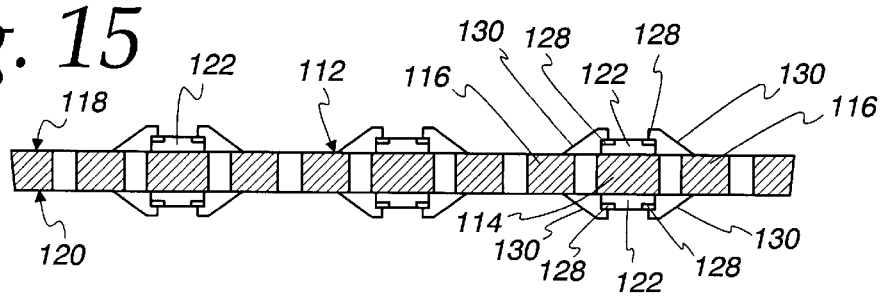

As shown in FIG. 15, electrode pads 128 on the semiconductor chips 122 are electrically connected to the leads 116 through conductive elements, in this case wires 130.

Figure 16:
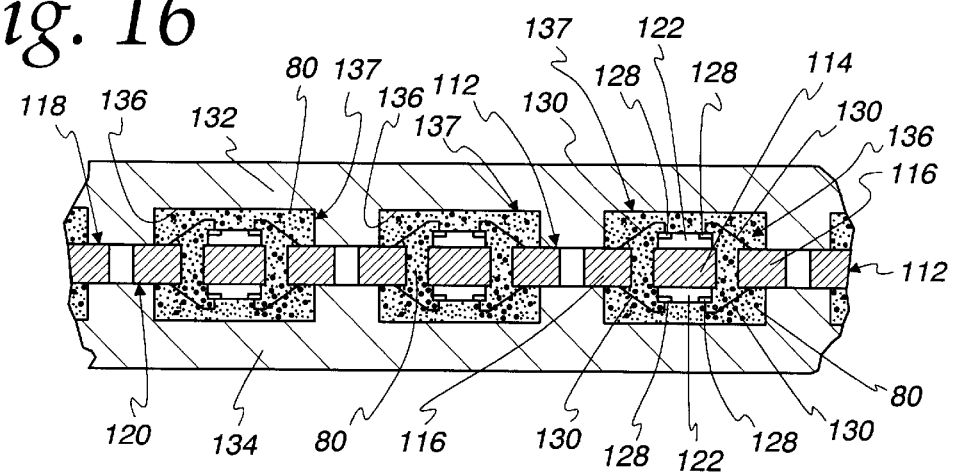

As shown in FIG. 16, the structure in FIG. 15 is placed between mold parts 132,134, which cooperatively define discrete cavities 136 around each of the supports 114 on opposite sides 118,120 of the lead frame assembly 112. Sealing resin 80 is then poured into the cavities 136, producing discrete masses 137 which are contiguous to the opposite sides 118, 120 of the lead frame assembly 112.

Figure 17:
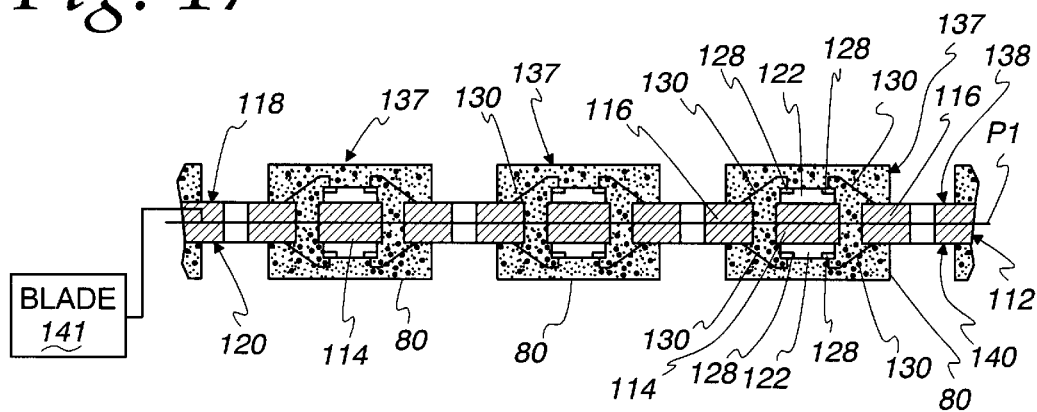

As shown in FIG. 17, the mold parts 132,134 are separated. By cutting through a plane P1, substantially midway between the sides 118,120 of the lead frame assembly 112, separate lead frame subassemblies 138,140 are formed, which are a mirror image of each other about the plane P1. The cutting in this process, as in those described above, may be accomplished by a relatively thin cutter blade 141 having a thickness on the order of 0.1 mm.

Figure 18:
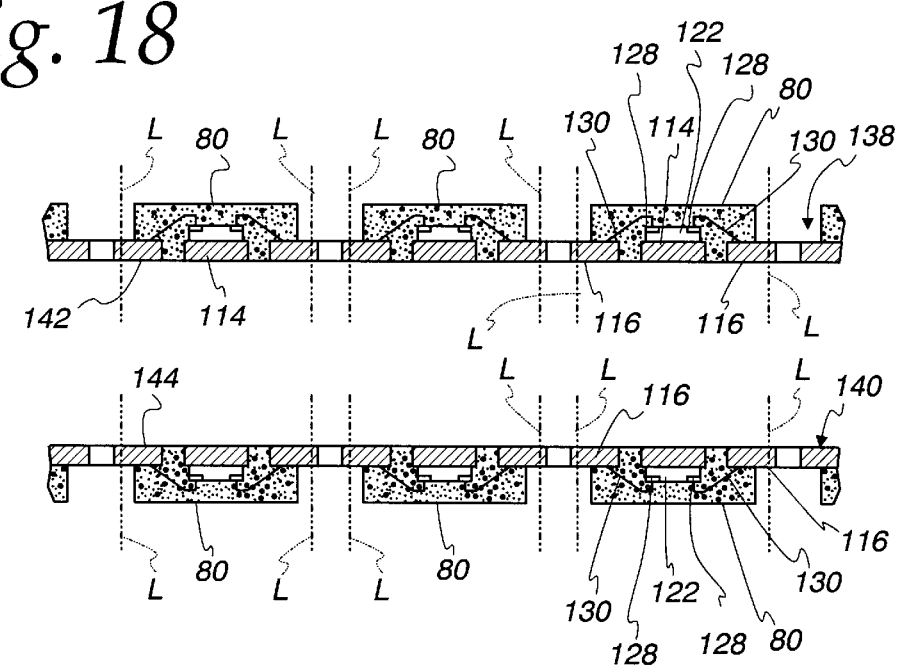
Figure 19:
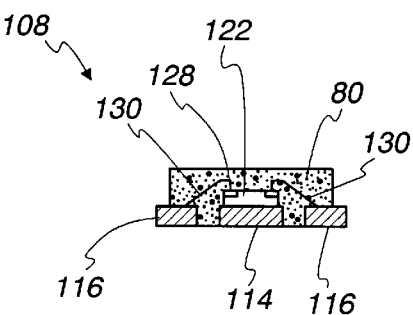
Figure 20:
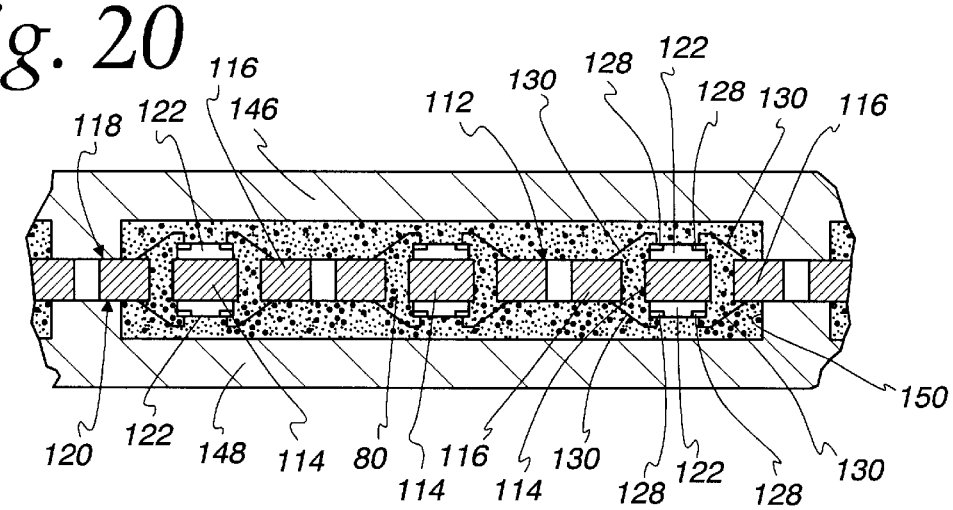

Thereafter, the lead frame subassemblies 138,140 are cut along the lines L in FIG. 18, as by a cutting blade, to separate the individual semiconductor devices 108, as shown in FIG. 19. The cutting blade does not pass through the sealing resin 80, thereby minimizing cutting resistance.

As in the prior embodiment, because the sealing resin 80 is formed on both sides 118, 120 of the lead frame assembly 112, the stresses induced by the different thermal expansion characteristics of the sealing resin 80 and lead frame assembly 112 on both sides thereof balances to minimize deformation. The solidified resin 80 maintains the integrity of the sealing frame subassemblies 138,140 before and after they are separated.

Since the cutting along the plane P1 exposes the leads 116 at the bottom sides 142,144 of the lead frame subassemblies 138,140, there is no problem with resin flash due to migration of the resin poured into the mold cavities 136.

An alternative form of the invention is described with respect to FIGS. 20 through 23. The lead frame assembly 112, previously described, has semiconductor chips 122 mounted thereon with electrode pads 128 electrically connected to leads 116 through wires 130, as previously described, to produce a structure shown in FIG. 15. This structure is then placed between mold parts 146,148 in FIG. 20, which cooperatively produce a single cavity 150 within which three, two-sided supports 114 and associated leads 116, exposed on opposite sides 118,120 of the lead frame assembly 112, reside. The mold parts 146,148 can be dimensioned so that more or less than the three supports 114 shown can be encompassed within the cavity 150.

Figure 21:
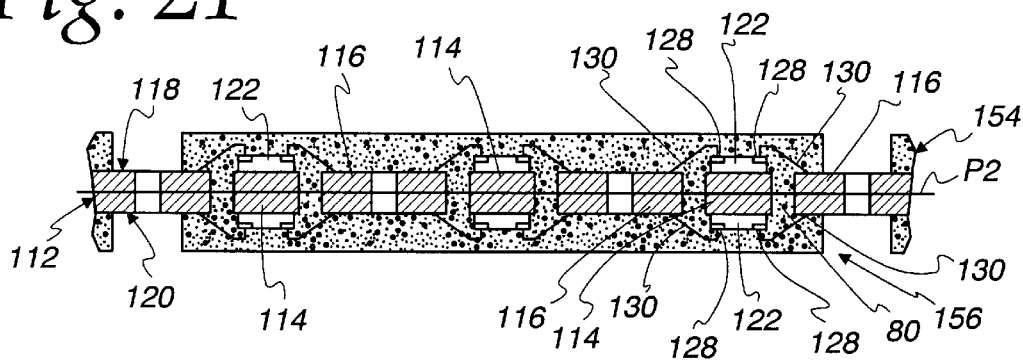

As shown in FIG. 21, the mold parts 146,148 are then separated from each other. This structure is then cut along a plane P2 midway between the sides 118,120 of the lead frame assembly 112 to form two lead frame subassemblies 154,156, corresponding to the lead frame subassemblies 138,140. The primary difference between the lead frame subassemblies 154,156 and the lead frame subassemblies 138,140 is that the sealing resin 80 is formed at a uniform thickness T3 continuously between the three supports 114 and associated leads 116.

Figure 22:
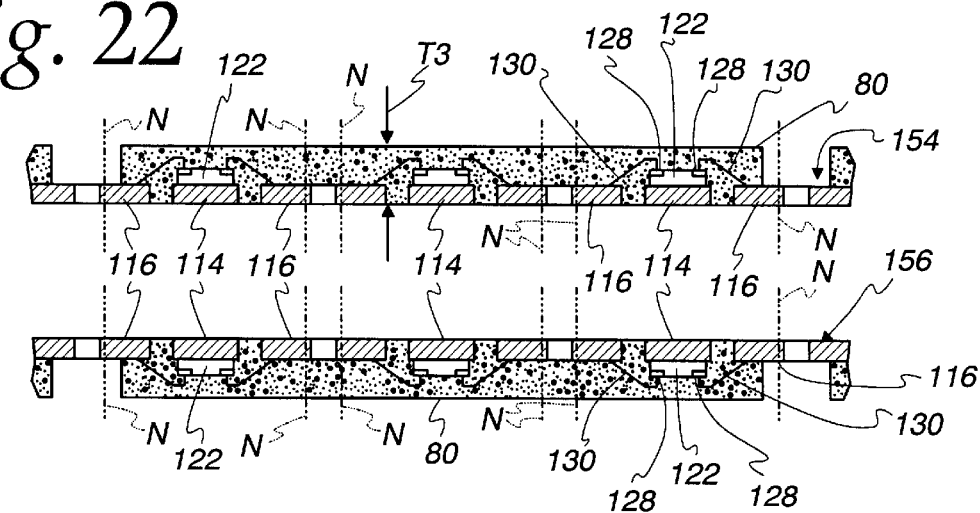
Figure 23:
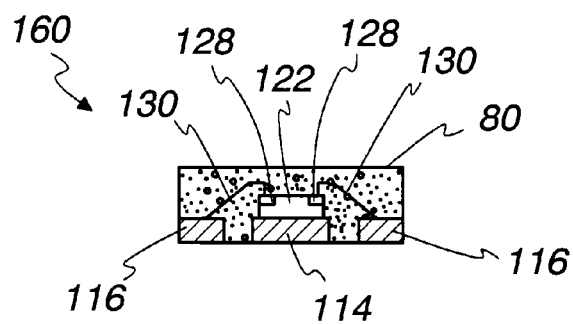

As shown in FIG. 22, the lead frame subassemblies 154,156 are then cut along the lines N to produce individual semiconductor devices 160.

Figure 24:
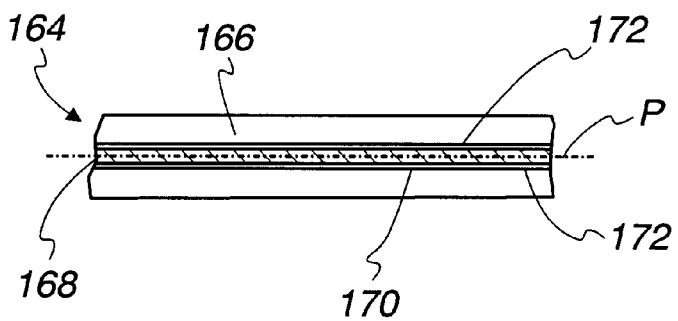
FIG. 24 is a fragmentary, cross-sectional view of a modified form of lead frame assembly, according to the present invention.

Variations from the methods described above are contemplated by the invention. As just one example, as shown in FIG. 24, a lead frame assembly 164 may be formed using three lead frame portions 166,168,170 joined through adhesive 172. The resulting lead frame assembly 164 can then be cut, as through a bisecting plane P3.

Still other arrangements of lead frame portions are contemplated.

The foregoing disclosure of specific embodiments is intended to be illustrative of the broad concepts comprehended by the invention.

What is claimed is:

1. A method of manufacturing semiconductor devices, said method comprising the steps of:
   providing a lead frame assembly having oppositely facing first and second sides and comprising a plurality of leads;
   mounting a first semiconductor chip on the first side of the lead frame assembly;
   mounting a second semiconductor chip on the second side of the lead frame assembly;
   electrically connecting the first semiconductor chip to a first lead on the lead frame assembly;
   electrically connecting the second semiconductor chip to a second lead on the lead frame assembly;
   applying sealing resin to the first and second sides of the lead frame assembly with the first and second semiconductor chips mounted thereon; and
   after applying sealing resin, separating the lead frame assembly between the first and second sides into first and second semiconductor devices,
   the first semiconductor device comprising a first portion of the lead frame assembly with the first semiconductor chip thereon and the first lead electrically connected to the first semiconductor chip,
   the second semiconductor device comprising a second portion of the lead frame assembly with the second semiconductor chip thereon and the second lead electrically connected to the second semiconductor chip.

2. The method of manufacturing semiconductor devices according to claim 1 wherein the step of providing a lead frame assembly comprises joining first and second lead frame portions together and the step of separating the lead frame assembly comprises separating the first and second lead frame portions from each other.

3. The method of manufacturing semiconductor devices according to claim 1 wherein the step of providing a lead frame assembly comprises providing a conductive layer and the step of separating the lead frame assembly comprises cutting the conductive layer through a plane between the first and second sides of the lead frame assembly.

4. The method of manufacturing semiconductor devices according to claim 1 further comprising the steps of mounting at least one additional semiconductor chip on each of the first and second sides of the lead frame assembly and electrically connecting each of the at least one additional semiconductor chips on the first and second sides of the lead frame assembly to a lead before applying sealing resin, the step of separating the lead frame assembly comprises the steps of a) separating the lead frame assembly into first and second lead frame subassemblies with the first lead frame subassembly comprising the first semiconductor chip and the one additional semiconductor chip mounted on the first side of the lead frame assembly and b) cutting the first lead frame subassembly so as to define the first semiconductor device and a third semiconductor device consisting of a portion of the lead frame assembly with the at least one additional semiconductor chip mounted on the first side of the lead frame assembly so that the third semiconductor device is separate from the first semiconductor device.

5. The method of manufacturing semiconductor devices according to claim 4 wherein the step of separating the lead frame assembly comprises a) separating the lead frame assembly into the first and second lead frame subassemblies with the second lead frame subassembly comprising the second semiconductor chip and the one additional semiconductor chip mounted on the second side of the lead frame assembly and b) cutting the second lead frame subassembly so as to define the second semiconductor device and a fourth semiconductor device consisting of a portion of the lead frame assembly with the at least one additional semiconductor chip mounted on the second side of the lead frame assembly so that the fourth semiconductor device is separate from the second semiconductor device.

6. The method of manufacturing semiconductor devices according to claim 1 wherein the step of applying sealing resin comprises using a mold to confine the sealing resin.

7. The method of manufacturing semiconductor devices according to claim 4 wherein the step of applying sealing resin comprises using a mold to confine the sealing resin in discrete masses of sealing resin over and around each of the first semiconductor chip and the at least one additional semiconductor chip on the first side of the lead frame assembly.

8. The method of manufacturing semiconductor devices according to claim 7 wherein the step of cutting the first lead frame assembly comprises cutting between the discrete masses of sealing resin.

9. The method of manufacturing semiconductor devices according to claim 2 wherein the step of joining the first and second lead frame portions comprises using a sheet with first and second adhesive layers and adhering the first lead frame portion to the first adhesive layer and the second lead frame portion to the second adhesive layer.

10. The method of manufacturing semiconductor devices according to claim 1 wherein the step of providing a lead frame comprises providing a lead frame having a sheet form.

11. The method of manufacturing semiconductor devices according to claim 4 wherein the step of applying sealing resin comprises applying a substantially uniform thickness of sealing resin continuously between the first semiconductor chip and the at least one additional semiconductor chip mounted on the first side of the lead frame assembly.

12. The method of manufacturing semiconductor devices according to claim 3 wherein the first and second portions of the lead frame assembly each have a first thickness and the conductive layer has a thickness three to five times the first thickness.

13. The method of manufacturing semiconductor devices according to claim 2 wherein the step of joining the first and second lead frame portions comprises joining the first and second lead frame portions using an adhesive and the step of separating the lead frame assembly comprises softening the adhesive to allow the first and second lead frame portions to be separated from each other.

14. The method of manufacturing semiconductor devices according to claim 1 wherein the step of cutting the first lead frame assembly comprises cutting using a cutting blade having a width on the order of 0.1 mm.

15. The method of manufacturing semiconductor devices according to claim 13 wherein the adhesive has a higher melting point than a melting point for the sealing resin.

16. The method of manufacturing semiconductor devices according to claim 13 wherein the adhesive comprises at least one of a) a polyester-type hot melt binder, b) a polyimide-type hot melt binder, and c) a thermoplastic rubber-type binder.

17. The method of manufacturing semiconductor devices according to claim 1 wherein the sealing resin comprises an epoxy resin.

18. The method of manufacturing semiconductor devices according to claim 4 wherein the first and second semiconductor devices have substantially the same construction.

19. The method of manufacturing semiconductor devices according to claim 4 wherein the step of cutting the first lead frame subassembly comprises cutting the first lead frame subassembly without cutting through the sealing resin on the first side of the lead frame subassembly.

20. The method of manufacturing semiconductor devices according to claim 4 wherein the step of cutting the first lead frame subassembly comprises cutting the first lead frame subassembly by cutting through the sealing resin on the first side of the lead frame subassembly.

* * * * *